(12) United States Patent
Onishi

(10) Patent No.: US 7,403,151 B2
(45) Date of Patent: Jul. 22, 2008

(54) SWITCH CONTROL CIRCUIT, ΔΣ MODULATION CIRCUIT, AND ΔΣ MODULATION AD CONVERTER

(75) Inventor: Akinobu Onishi, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/462,690

(22) Filed: Aug. 4, 2006

(65) Prior Publication Data

US 2007/0171118 A1     Jul. 26, 2007

(30) Foreign Application Priority Data

Aug. 5, 2005     (JP)     ............................ 2005-228700

(51) Int. Cl.
*H03M 1/12* (2006.01)
(52) U.S. Cl. ........................ 341/172; 341/143; 341/155
(58) Field of Classification Search ................. 341/143, 341/172
See application file for complete search history.

(56) References Cited

U.S. PATENT DOCUMENTS

| | | | | | |
|---|---|---|---|---|---|
| 4,851,841 | A | * | 7/1989 | Sooch | ........................ 341/143 |
| 5,134,401 | A | * | 7/1992 | McCartney et al. | ......... 341/143 |
| 5,447,481 | A | * | 9/1995 | Emter, Jr. | .................... 482/104 |
| 5,459,464 | A | * | 10/1995 | Beneteau et al. | ............. 341/143 |
| 5,659,314 | A | * | 8/1997 | Tokura et al. | ................ 341/143 |
| 5,745,606 | A | * | 4/1998 | Yoshimichi | .................. 382/237 |
| 6,037,887 | A | * | 3/2000 | Wu et al. | ..................... 341/143 |
| 6,061,009 | A | * | 5/2000 | Krone et al. | ................. 341/143 |
| 6,166,595 | A | * | 12/2000 | Moldsvar et al. | ............... 330/9 |
| 6,473,018 | B2 | * | 10/2002 | Ueno et al. | .................. 341/143 |
| 6,621,441 | B2 | * | 9/2003 | Haroun et al. | ............... 341/155 |
| 7,142,144 | B1 | * | 11/2006 | Farooqi et al. | ............... 341/143 |
| 7,209,061 | B2 | * | 4/2007 | Somayajula | ................. 341/122 |
| 2006/0103561 | A1 | * | 5/2006 | Abe et al. | .................... 341/143 |

FOREIGN PATENT DOCUMENTS

| | | |
|---|---|---|
| JP | 10-084255 | 3/1998 |
| JP | 2002-141802 | 5/2002 |

\* cited by examiner

*Primary Examiner*—Khai M Nguyen
(74) *Attorney, Agent, or Firm*—SoCal IP Law Group LLP; Steven C. Sereboff; John E. Gunther

(57) ABSTRACT

A switch control circuit turns on/off second and third switches, while turning off/on first and fourth switches, in a complementary manner in an integrator constituted by using a switched capacitor including the first to fourth switches and, where the first and fourth switches are turned off and the second and third switches are turned on, the switch control circuit turns on the second switch before turning off the fourth switch.

14 Claims, 10 Drawing Sheets

SWITCH CONTROL CIRCUIT, ΔΣ MODULATION CIRCUIT, AND ΔΣ MODULATION AD CONVERTER

CROSS-REFERENCE TO RELATED APPLICATION

This application claims the benefit of priority to Japanese Patent Application No. 2005-228700, filed Aug. 5, 2005, of which full contents are incorporated herein by reference.

BACKGROUND OF THE INVENTION

1. Field of the Invention

The present invention relates to a switch control circuit, a ΔΣ modulation circuit, and a ΔΣ modulation analog to digital (AD) converter.

2. Description of the Related Art

An AD converter using a ΔΣ modulation circuit (see, e.g., Japanese Patent Application Laid-Open Publication No. 2002-141802) is known as an AD converter used in audio equipments, etc. The ΔΣ modulation circuit used in such a AD converter is realized by an integrator that integrates and outputs an input analog signal, a quantizer that outputs a digital signal converted from the integrated analog signal, etc.

The integrator can be constituted by combining a switched capacitor and an operational amplifier. FIG. 9 shows a configuration example of an integrator using a switched capacitor and an operational amplifier. An integrator 100 includes an operational amplifier 110, an integration capacitor 111, and a switched capacitor including switches SW11 to SW14 and a capacitor 112.

One electrode of the integration capacitor 111 is electrically connected to an output terminal of the operational amplifier 110 and the other electrode is electrically connected to an inverting input terminal of the operational amplifier 110. An intermediate voltage Vdd/2 is applied to a noninverting input terminal of the operational amplifier 110. The switched capacitor including the switches SW11 to SW14 and the capacitor 112 is electrically connected to an inverting input terminal of the operational amplifier 110.

While the switches SW12, SW13 are turned on and the switches SW11, SW14 are turned off in such an integrator 100, the capacitor 112 accumulates electric charge corresponding to a difference between an input voltage Vin and the intermediate voltage Vdd/2 (a sampling process). When the switches SW12, SW13 are turned off and the switches SW11, SW14 are turned on, the electric charge accumulated in the capacitor 112 flows into the integration capacitor 111 and the capacitor 111 accumulates the electric charge (an integration process). When the sampling process and the integration process are performed repeatedly, the output voltage Vout of the operation amplifier 110 is a voltage acquired by integrating the input voltage Vin.

By the way, since the ΔΣ modulation circuit must perform the sampling process and the integration process highly accurately to increase resolution, the on/off timing of the switches SW12, SW13 may be shifted or the on/off timing of the switches SW12, SW14 may be shifted (see, e.g., Japanese Patent Application Laid-Open Publication No. 1990-84255). FIG. 10 shows a typical configuration example of a switch control circuit that generates a four-phase clock controlling the on/off of switches SW11 to SW14. A switch control circuit 120 includes NOR circuits 130 to 132 and inverter circuits 133 to 138.

To the NOR circuit 130, a standby signal STB is input through the inverter circuit 133 and a main clock CLK is input. The standby signal is H-level at the time of operation. Therefore, at the time of operation, the NOR circuit 130 outputs a signal that is the inverted main clock CLK.

The signal output from the NOR circuit 130 is input to the NOR circuit 131 and is input to the NOR circuit 132 through the inverter circuit 134. An even number of the inverter circuits 135 is disposed at a subsequent stage of the NOR circuit 132, and the output thereof is a clock signal CK1 controlling the on/off of the switch SW11. An even number of the inverter circuits 136 is disposed at a subsequent stage thereof, and the output thereof is a clock signal CK4 controlling the on/off of the switch SW14. The output of the inverter circuit 136 is input to the NOR circuit 131.

Similarly, the inverter circuits 137 of the same number as the inverter circuits 135 are disposed at a subsequent stage of the NOR circuit 131, and the output thereof is a clock signal CK2 controlling the on/off of the switch SW12. The inverter circuits 138 of the same number as the inverter circuits 136 are disposed at a subsequent stage thereof, and the output thereof is a clock signal CK3 controlling the on/off of the switch SW13. The output of the inverter circuit 138 is input to the NOR circuit 132.

In this example, when the clock signals CK1 to CK4 are H-level, the switches SW11 to SW14 are turned on, respectively.

FIG. 11 is a timing chart of the operation of the switch control circuit 120. It is assumed that the main clock CLK is changed from L-level to H-level at time t1. One input of the NOR circuit 131 becomes L-level and One input of the NOR circuit 132 becomes H-level. Therefore, the output of the NOR circuit 132 becomes L-level; the clock signal CK1 becomes L-level at time t2; and the clock signal CK4 becomes L-level at time t3. When clock signal CK4 becomes L-level, the output of the NOR circuit 131 becomes H-level; the clock signal CK2 becomes H-level at time t4; the clock signal CK3 becomes H-level at time t5.

It is assumed that the main clock changes from H-level to L-level at time t6. One input of the NOR circuit 131 becomes H-level and One input of the NOR circuit 132 becomes L-level. Therefore, the output of the NOR circuit 131 becomes L-level; the clock signal CK2 becomes L-level at time t7; and the clock signal CK3 becomes L-level at time t8. When clock signal CK3 becomes L-level, the output of the NOR circuit 132 becomes H-level; the clock signal CK1 becomes H-level at time t9; the clock signal CK4 becomes H-level at time t10.

In this way, the highly accurate sampling process and integration process are performed by turning on/off the switches SW11 to SW14 with the four-phase clock signals generated by the switch control circuit 120.

As described above, when the switches SW12, SW13 are turned on and the switches SW11, SW14 are turned off, the capacitor 112 accumulates electric charge, and when the switches SW12, SW13 are turned off and the switches SW11, SW14 are turned on, the electric charge flows into the capacitor 111. Since the noninverting input terminal and inverting input terminal of the operational amplifier 110 are imaginary-shorted, the voltage of the inverting input terminal becomes equal to the intermediate voltage Vdd/2 applied to the noninverting input terminal in theory. Therefore, the whole electric charge accumulated in the capacitor 112 flows into the capacitor 111 when the switches SW12, SW13 are turned off and the switches SW11, SW14 are turned on.

However, actually, since the operational amplifier 110 has an offset, the voltage of the inverting input terminal becomes a voltage higher or lower than the intermediate voltage Vdd/2 applied to the noninverting input terminal by the offset α.

Therefore, if the switches SW11, SW14 are turned on, in the electric charge accumulated in the capacitor 12, electric charge corresponding to the offset α does not flow into the capacitor 111 and stays in the capacitor 112.

If the electric charge stays in the capacitor 112, the accuracy of the integration of the input voltage Vin is reduced in the integrator 100. When such a integrator 100 is used, the modulation accuracy of the ΔΣ modulation circuit is reduced and a distortion rate is deteriorated in the ΔΣ modulation AD converter.

FIG. 12 shows theoretical distortion rate characteristics corresponding to amplitude of an analog signal (the input signal Vin) input to the ΔΣ modulation AD converter. The distortion rate (THD+N) has a lower value in the upper portion of FIG. 12. As shown in FIG. 12, in theory, the distortion rate is minimized at amplitude (−1 to −3 dBFS) slightly lower than the full scale (0 dBFS), which is the maximum amplitude that can input.

FIG. 13 shows actual distortion rate characteristics corresponding to amplitude of the analog signal input to the ΔΣ modulation AD converter. As shown in FIG. 13, when the distortion rate is minimized in the actual distortion rate characteristics, the input amplitude is lower than the theoretical amplitude and the distortion rate has a value higher than the theoretical distortion value. That is, since the electric charge stays in the capacitor 112 constituting the integrator used in the ΔΣ modulation AD converter, the distortion rate is deteriorated as shown in FIG. 13.

SUMMARY OF THE INVENTION

The present invention was conceived in consideration of the above problems and it is therefore the object of the present invention to improve integration accuracy of an integrator and modulation accuracy of a ΔΣ modulation circuit to constrain deterioration of a distortion rate in a ΔΣ modulation AD converter.

In order to achieve the above object, according to a first aspect of the present invention there is provided a switch control circuit of an integrator, the integrator including an operational amplifier that has an input terminal and an output terminal; a first capacitor that has first and second electrodes, the first electrode being electrically connected to the output terminal of the operational amplifier, the second electrode being electrically connected to the input terminal of the operational amplifier; a second capacitor that has third and fourth electrodes; a first switch that intervenes between the third electrode of the second capacitor and the input terminal of the operational amplifier; a second switch that causes a reference voltage to be applied to the third electrode of the second capacitor; a third switch that causes an input voltage to be applied to the fourth electrode of the second capacitor; and a fourth switch that causes the reference voltage to be applied to the fourth electrode of the second capacitor, the switch control circuit turning on/off the second and third switches of the integrator, while turning off/on the first and fourth switches of the integrator, in a complementary manner, wherein where the first and fourth switches are turned off and the second and third switches are turned on, the switch control circuit turns on the second switch before turning off the fourth switch.

In the switch control circuit of the present invention, when a main clock changing at predetermined time intervals is changed to one logical value, after second and third clocks for controlling the on/off of the second and third switches are changed and output so as to turn off the second and third switches, first and fourth clocks for controlling the on/off of the first and fourth switches may be changed and output so as to turn on the first and fourth switches. When the main clock is changed to the other logical value, after the first and second clocks are changed and output so as to turn off the first switch and turn on the second switch, the fourth and third clocks may be changed and output so as to turn off the fourth switch and turn on the third switch The switch control circuit of the present invention may comprise a first logical circuit to which first and second input signals are input, the first logical circuit outputting a signal corresponding to the first input signal when the first input signal is of one logical value, the first logical circuit outputting a signal corresponding to the second input signal when the first input signal is of the other logical value; a delay circuit that delays the signal output from the first logical circuit for predetermined time to output the signal as the first clock; a second logical circuit to which third and fourth input signals are input, the second logical circuit outputting a signal corresponding to the third input signal as the second clock when the third input signal is of one logical value, the second logical circuit outputting a signal corresponding to the fourth input signal as the second clock when the third input signal is of the other logical value; a third logical circuit to which fifth and sixth input signals are input, the third logical circuit outputting a signal corresponding to the fifth input signal as the third clock when the fifth input signal is of one logical value, the third logical circuit outputting a signal corresponding to the sixth input signal as the third clock when the fifth input signal is of the other logical value; and a fourth logical circuit to which seventh and eighth input signals are input, the fourth logical circuit outputting a signal corresponding to the seventh input signal as the fourth clock when the seventh input signal is of one logical value, the fourth logical circuit outputting a signal corresponding to the eighth input signal as the fourth clock when the seventh input signal is of the other logical value, wherein the first input signal is a signal corresponding to the main clock, the second input signal being a signal corresponding to the second clock, the third input signal being a signal acquired by inverting the first input signal, the fourth input signal being a signal corresponding to the signal output from the first logical circuit, the fifth input signal being a signal corresponding to the signal output from the first logical circuit, the sixth input signal being a signal corresponding to the fourth clock, the seventh input signal being a signal corresponding to the second clock, the eighth input signal being a signal corresponding to the third clock, the predetermined time in the delay circuit being longer than a time period after the fifth input signal of the one logical value is input to the third logical circuit until the third clock is output.

In the switch control circuit of the present invention, the first through fourth switches are preferably CMOS switch circuits controlled by the first through fourth clocks and by fifth through eighth clocks acquired by inverting the first through fourth clocks, the switch control circuit may comprise a fifth logical circuit that outputs the fifth clock acquired by inverting the first clock; a sixth logical circuit that outputs the sixth clock acquired by inverting the second clock; a seventh logical circuit that outputs the seventh clock acquired by inverting the third clock; and an eighth logical circuit that outputs the eighth clock acquired by inverting the fourth clock.

In order to achieve the above object, according to a second aspect of the present invention there is provided a ΔΣ modulation circuit comprising an integrator that includes an operational amplifier that has an input terminal and an output terminal, a first capacitor that has first and second electrodes, the first electrode being electrically connected to the output terminal of the operational amplifier, the second electrode being electrically connected to the input terminal of the operational amplifier, a second capacitor that has third and fourth electrodes, a first switch that controls electric connection between the third electrode of the second capacitor and the input terminal of the operational amplifier, a second switch that controls application of a reference voltage to the third electrode of the second capacitor, a third switch that controls application of an input voltage to the fourth electrode of the second capacitor, and a fourth switch that controls application of the reference voltage to the fourth electrode of the second capacitor, the integrator integrating and outputting the input voltage; a switch control circuit that turns on/off the second and third switches, while turning off/on the first and fourth switches, in a complementary manner; a quantizer that quantizes and outputs the output of the integrator; and a subtraction circuit that reduces electric charge accumulated in the first capacitor depending on the output of the quantizer, wherein where the first and fourth switches are turned off and the second and third switches are turned on, the switch control circuit turns on the second switch before turning off the fourth switch.

In order to achieve the above object, according to a third aspect of the present invention there is provided a $\Delta\Sigma$ modulation AD converter comprising the $\Delta\Sigma$ modulation circuit that oversamples the input voltage as an analog signal and converts the analog signal to a digital signal for output; and a digital filter that thins and outputs the oversampled digital signal output from the $\Delta\Sigma$ modulation circuit at a predetermined frequency.

BRIEF DESCRIPTION OF THE DRAWINGS

To understand the present invention and the advantages thereof more thoroughly, the following description should be referenced along with the accompanying drawings.

DETAILED DESCRIPTION OF THE INVENTION

Figure 1:
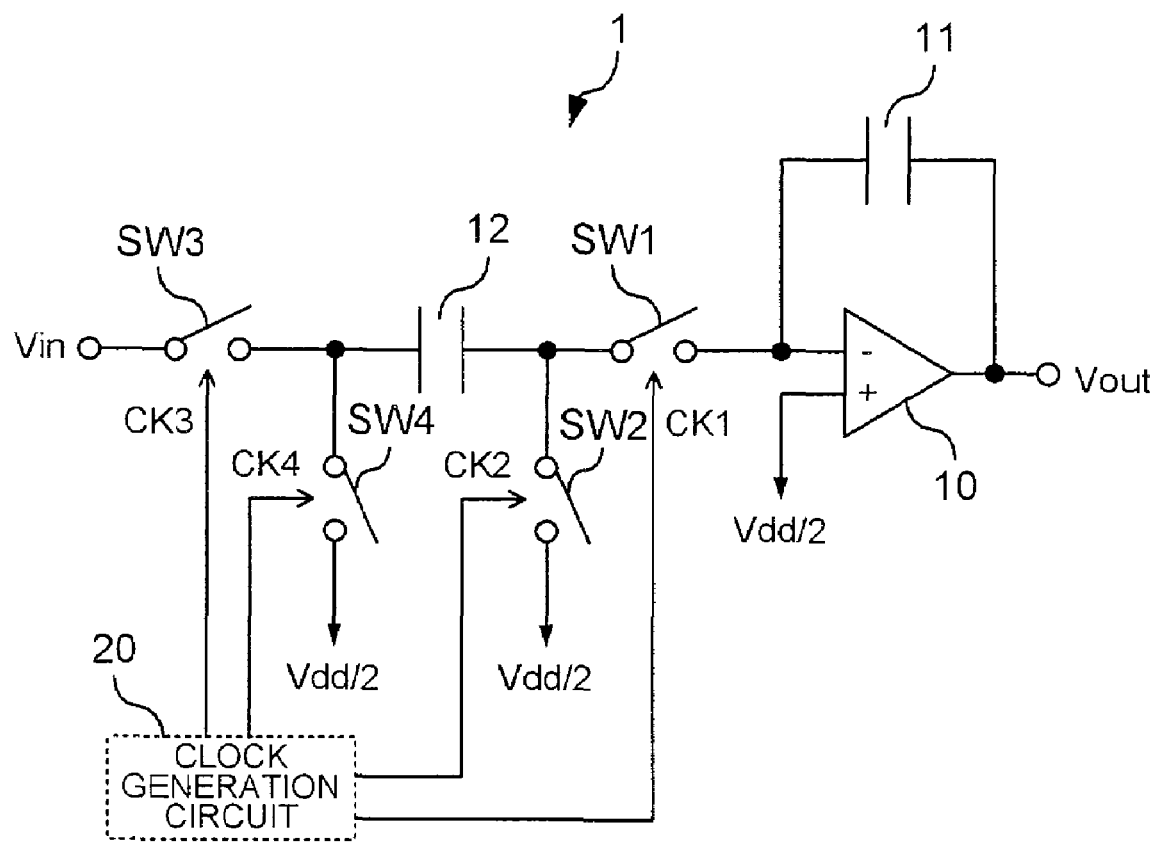
FIG. 1 shows a configuration of an integrator controlled by a switch control circuit of one embodiment of the present invention.

From the contents of the description and the accompanying drawings, at least the following details will be apparent.
==Integrator==
FIG. 1 shows a configuration of an integrator controlled by a switch control circuit of one embodiment of the present invention. An integrator 1 includes an operational amplifier 10, an integration capacitor 11 (first capacitor), and a switched capacitor including switches SW1 to SW4 (first to fourth switches) and a capacitor 12 (second capacitor).

One electrode (a first electrode) of the integration capacitor 11 is electrically connected to an output terminal of the operational amplifier 10 and the other electrode (a second electrode) is electrically connected to an inverting input terminal of the operational amplifier 10. An intermediate voltage Vdd/2 is applied to a noninverting input terminal of the operational amplifier 10.

The switch SW1 is a switch that controls electric connection between one electrode (a third electrode) of the capacitor 12 and the inverting input terminal of the operational amplifier 10. The switch SW2 is a switch that controls the application of the intermediate voltage Vdd/2 (a reference voltage) to one electrode (the third electrode) of the capacitor 12. The switch SW3 is a switch that controls the application of the input voltage Vin to the other electrode (a fourth electrode) of the capacitor 12. The switch SW4 is a switch that controls the application of the intermediate voltage Vdd/2 to the other electrode (fourth electrode) of the capacitor 12.

The on/off of the switches SW1 to SW4 is controlled with four-phase clock signals CK1 to CK4 output from a switch control circuit 20. In this embodiment, when the clock signals CK1 to CK4 are H-level, the switches SW1 to SW4 are turned on, respectively.

Figure 2:
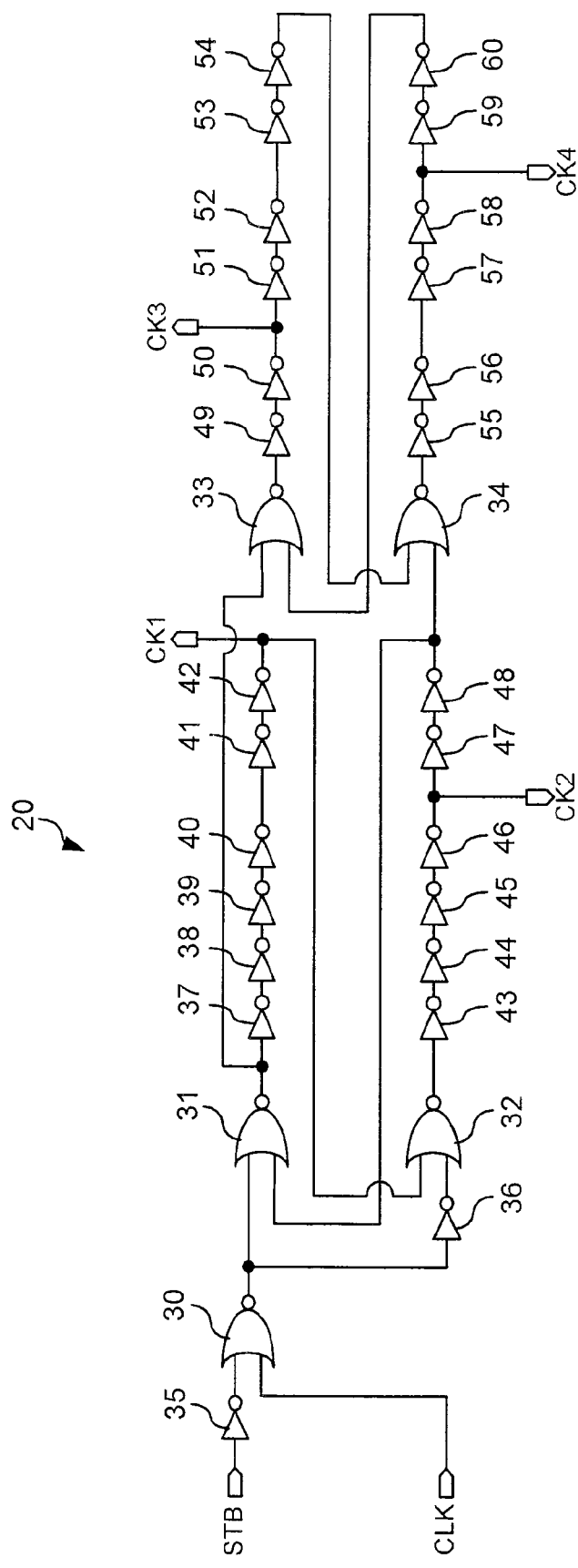
FIG. 2 shows a configuration of the switch control circuit of one embodiment of the present invention.

While the switches SW2, SW3 are turned on and the switches SW1, SW4 are turned off in such an integrator 1, the capacitor 12 accumulates electric charge corresponding to a difference between the input voltage Vin and the intermediate voltage Vdd/2 (a sampling process). When the switches SW2, SW3 are turned off and the switches SW1, SW4 are turned on, the electric charge accumulated in the capacitor 12 flows into the integration capacitor 11 and the capacitor 11 accumulates the electric charge (an integration process). When the sampling process and the integration process are performed repeatedly, the output voltage Vout of the operation amplifier 10 is a voltage acquired by integrating the input voltage Vin.
==Switch Control Circuit==
FIG. 2 shows a configuration of the switch control circuit 20. The switch control circuit 20 includes NOR circuits 30 to 34 and inverter circuits 35 to 60.

To the NOR circuit 30, a standby signal STB is input through the inverter circuit 35 and a main clock CLK is input. The standby signal is H-level at the time of operation of the integrator 1. Therefore, at the time of operation, the NOR circuit 30 outputs a signal that is the inverted main clock CLK.

The signal (a first signal) output from the NOR circuit 30 is input to the NOR circuit 31 and a signal (a third signal) inverted by the inverter circuit 36 is input to the NOR circuit 32. An even number (e.g., six) of the inverter circuits 37 to 42 is disposed at a subsequent stage of the NOR circuit 31, and the output of the inverter circuit 42 is a clock signal CK1 controlling the on/off of the switch SW1. A signal (a fourth signal) output from the inverter circuit 42 is input to the NOR circuit 32.

An even number (e.g., four) of the inverter circuits 43 to 46 is disposed at a subsequent stage of the NOR circuit 32, and the output of the inverter circuit 46 is a clock signal CK2 controlling the on/off of the switch SW2. An even number (e.g., two) of the inverter circuits 47 to 48 is disposed at a subsequent stage of the inverter circuit 46, and a signal (a second signal, a seventh signal) output from the inverter circuit 48 is input to the NOR circuit 31 and the NOR circuit 34.

A signal (a fifth signal) output from the NOR circuit 31 is input to the NOR circuit 33. An even number (e.g., two) of the inverter circuits 49, 50 is disposed at a subsequent stage of the NOR circuit 33, and the output of the inverter circuit 50 is a clock signal CK3 controlling the on/off of the switch SW3. An even number (e.g., four) of the inverter circuits 51 to 54 is disposed at a subsequent stage of the inverter circuit 50, and a signal (an eighth signal) output from the inverter circuit 54 is input to the NOR circuit 34.

An even number (e.g., four) of the inverter circuits 55 to 58 is disposed at a subsequent stage of the NOR circuit 34, and the output of the inverter circuit 58 is a clock signal CK4 controlling the on/off of the switch SW4. An even number (e.g., two) of the inverter circuits 59, 60 is disposed at a subsequent stage of the inverter circuit 58, and a signal (a sixth signal) output from the inverter circuit 60 is input to the NOR circuit 33.

The NOR circuit 31 corresponds to a first logical circuit of the present invention and the inverter circuits 37 to 42 correspond to a delay circuit of the present invention. The NOR circuit 32 and the inverter circuits 43 to 46 correspond to a second logical circuit of the present invention; the NOR circuit 33 and the inverter circuits 49, 50 correspond to a third logical circuit of the present invention; and NOR circuit 34 and the inverter circuits 55 to 58 correspond to a fourth logical circuit of the present invention.

==Description of Operation==

Description will be made of the operation of the switch control circuit 20 at the time of the operation of the integrator 1, i.e., when the standby signal STB is H-level. In the embodiment, it is assumed that the same delay time is generated by each of the inverter circuits 35 to 60.

Figure 3:
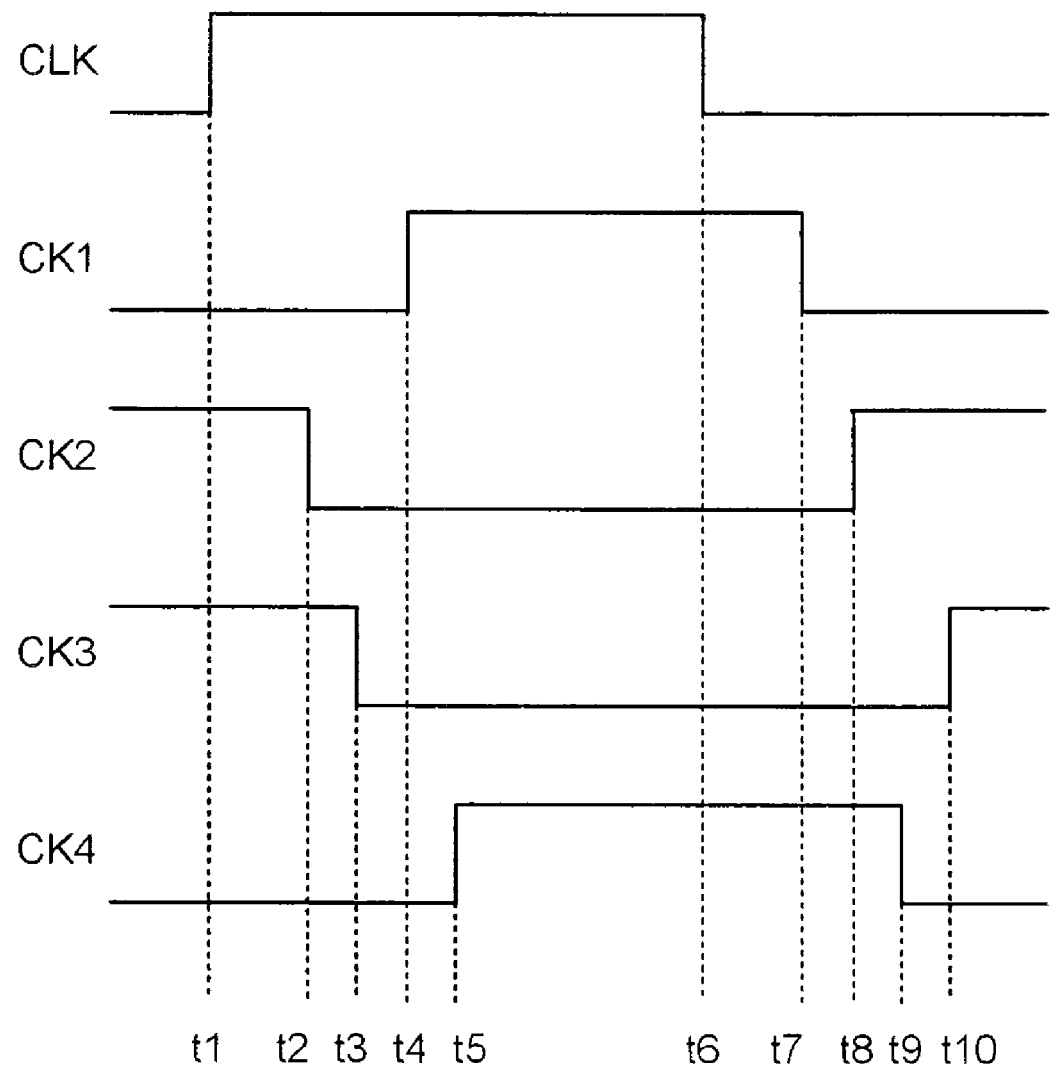
FIG. 3 is a timing chart of the operation of the switch control circuit of the embodiment.

FIG. 3 is a timing chart of the operation of the switch control circuit 20 of the embodiment. It is assumed that the main clock CLK is changed from L-level to H-level at time t1. One input of the NOR circuit 31 becomes L-level and One input of the NOR circuit 32 becomes H-level. Therefore, the output of the NOR circuit 32 becomes L-level; the clock signal CK2 becomes L-level at time t2; and the L-level signal output from the inverter circuit 48 is input to the NOR circuit 31. As a result, the output of the NOR circuit 31 becomes H-level.

The H-level signal output from the NOR circuit 31 is input to the inverter circuit 37 as well as the NOR circuit 33, and the output of the NOR circuit 33 becomes L-level. The output of the NOR circuit 31 passes through the six inverter circuits 37 to 42 to become the clock signal CK1, and the output of the NOR circuit 33 passes through the two inverter circuits 49, 50 to become the clock signal CK3. Therefore, the clock signal CK3 becomes L-level at time t3 and the clock signal CK1 becomes H-level at time t4, which is later than the time t3.

When the clock signal CK3 becomes L-level, the L-level signal output from the inverter circuit 54 is input to the NOR circuit 34. As a result, the output of the NOR circuit 34 becomes H-level and the clock signal CK4 becomes H-level at time t5.

Although the six inverter circuits 37 to 42 are disposed at the subsequent stage of NOR circuit 31 in this embodiment, this is not a limitation and any circuits may be used as long as the circuit generates delay time longer than a time period after the output of the NOR circuit 31 changes to H-level until the clock signal CK3 changes.

It is assumed that the main clock changes from H-level to L-level at time t6. One input of the NOR circuit 31 becomes H-level and One input of the NOR circuit 32 becomes L-level. Therefore, the output of the NOR circuit 31 becomes L-level, and the L-level signal is input to the inverter circuit 37 as well as the NOR circuit 33. At time t7, the output of the inverter circuit 42, i.e., the clock signal CK1 becomes L-level. Since the clock signal CK4 is H-level at this point of time, the output of the NOR circuit 33 maintains L-level and the clock signal CK3 maintains L-level.

When the L-level signal output from the inverter circuit 42 is input to the NOR circuit 32, the output of the NOR circuit 32 becomes H-level, and the clock signal CK2 becomes H-level at time t8. When the clock signal CK2 becomes H-level, the H-level signal output from the inverter circuit 48 is input to the NOR circuit 34. As a result, the output of the NOR circuit 34 becomes L-level, and the clock signal CK4 becomes L-level at time t9.

When the clock signal CK4 becomes L-level, the L-level signal output from the inverter circuit 60 is input to the NOR circuit 33. As a result, the output of the NOR circuit 33 becomes H-level, and the clock signal CK3 becomes H-level at time t10.

Description will be made of the operation of the integrator 1 when the four-phase clock signals CK1 to CK4 are changed in this way. At the time t1, the switches SW2, SW 3 is turned on and the switches SW1, SW 4 is turned off. Therefore, the sampling capacitor 12 accumulates electric charge corresponding to the input voltage Vin. The switch SW2 is turned off at the time t2; the switch SW3 is turned off at the time t3; the switch SW1 is turned on at the time t4; and the switch SW4 is turned on at the time t5. Therefore, the electric charge accumulated in the sampling capacitor 12 flows into the integration capacitor 11. When the offset of the operational amplifier 10 is $\alpha$, the voltage at the inverting input terminal of the operational amplifier 10 is Vdd/2+$\alpha$, and electric charge corresponding to $\alpha$ stays in the capacitor 12.

The switch SW1 is turned off at the time t7 and the switch SW2 is turned on at the time t8. Since the switch SW 4 is still in the on-state at time t8, the intermediate voltage Vdd/2 is applied to both electrodes of the capacitor 12 and the electric charge remaining in the capacitor 12 is discharged. Since the switch SW4 is turned off at the time t9 and the switch SW3 is turned on at the time t10, the capacitor 12 accumulates the electric charge corresponding to the input voltage Vin. That is, since the electric charge does not stay in the capacitor 12 when the sampling of the input voltage Vin is started, the sampling accuracy can be increased to increase the integration accuracy in the integrator 1.

Although the switches SW1 to SW4 are switches turned on when the clock signals CK1 to CK4 are H-level in this embodiment, this is not a limitation to the form of the switches and, for example, a CMOS switch circuit can be used which is turned on/off under the control of two clock signals in a complementary relationship.

Figure 4:
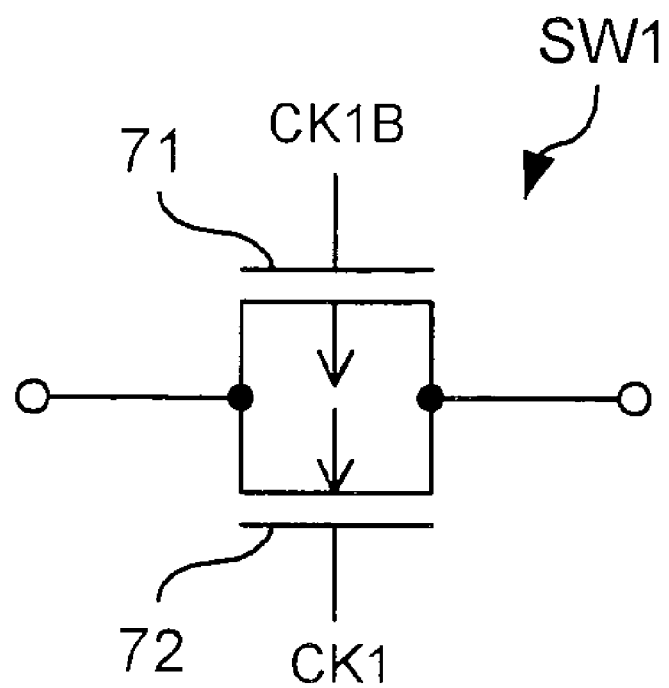
FIG. 4 shows a configuration example of a switch constituted by using an N-MOSFET and a P-MOSFET.

FIG. 4 shows a configuration example when the switch SW1 is the CMOS switch circuit. The switch SW1 is the CMOS switch circuit with a P-MOSFET 71 and an N-MOSFET 72 connected in parallel. The aforementioned clock signal CK2 is input to the gate of the N-MOSFET 72, and a clock signal CK1B, i.e., the inverted clock signal CK1 is input to the gate of the P-MOSFET 71.

Figure 5:
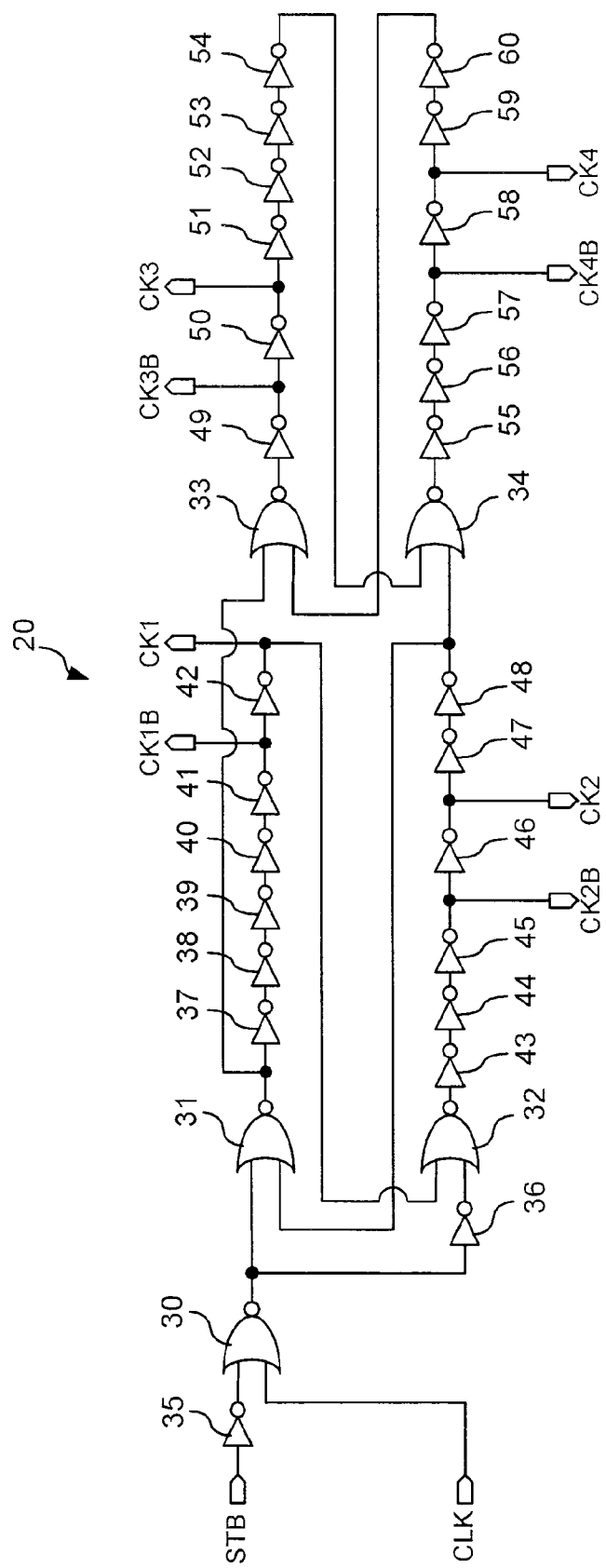
FIG. 5 shows a configuration of a switch control circuit that generates a four-phase clock controlling the switch constituted by using the N-MOSFET and the P-MOSFET.

FIG. 5 shows a configuration of the switch control circuit 20 when the switch SW1 is the CMOS switch circuit. As shown in FIG. 5, the clock signal CK1B (a fifth clock) is an input signal of the inverter circuit 42 outputting the clock signal CK1, i.e., a signal acquired by inverting the clock signal CK1. Similarly, if the switches SW2 to SW4 are the CMOS switch circuits, the input signals of the inverter circuits outputting the clock signals CK2 to CK4 are clock signals CK2B to CK4B (sixth to eighth clock) acquired by inverting the clock signal CK2 to CK4. An odd number of the inverter circuits 37 to 41 correspond to a fifth logical circuit of the present invention. Similarly, the inverter circuits 43 to 45 correspond to a sixth logical circuit of the present invention; the inverter circuits 49 corresponds to a seventh logical circuit of the present invention; and the inverter circuits 55 to 57 correspond to an eighth logical circuit of the present invention.

When using the CMOS circuit with lower power consumption, the same control can be performed with the switch control circuit 20.

APPLICATION EXAMPLE

Figure 6:
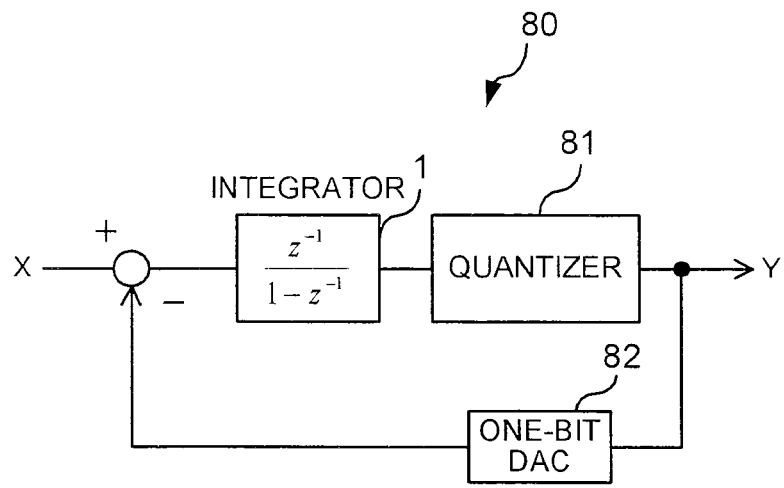
FIG. 6 shows a configuration of a $\Delta\Sigma$ modulation circuit using an integrator controlled by the switch control circuit of the embodiment.

Description will be made of an application example of the integrator 1 controlled by the switch control circuit 20. FIG. 6 shows a configuration of a ΔΣ modulation circuit using the integrator 1 controlled by the switch control circuit 20 of the embodiment. A ΔΣ modulation circuit 80 is a first order one-bit ΔΣ modulation circuit including the integrator 1, a quantizer 81, and a one-bit DA converter (one-bit DAC) 82.

An input analog signal (X) is integrated by the integrator 1. The quantizer 81 outputs +1 when the integration result output from the integrator 1 is equal to or greater than a predetermined value and outputs −1 when the integration result is less than the predetermined value. If the output of the quantizer 81 is +1, the one-bit DAC 82 subtracts a value corresponding to "+1" from the value integrated by the integrator 1.

Figure 7:
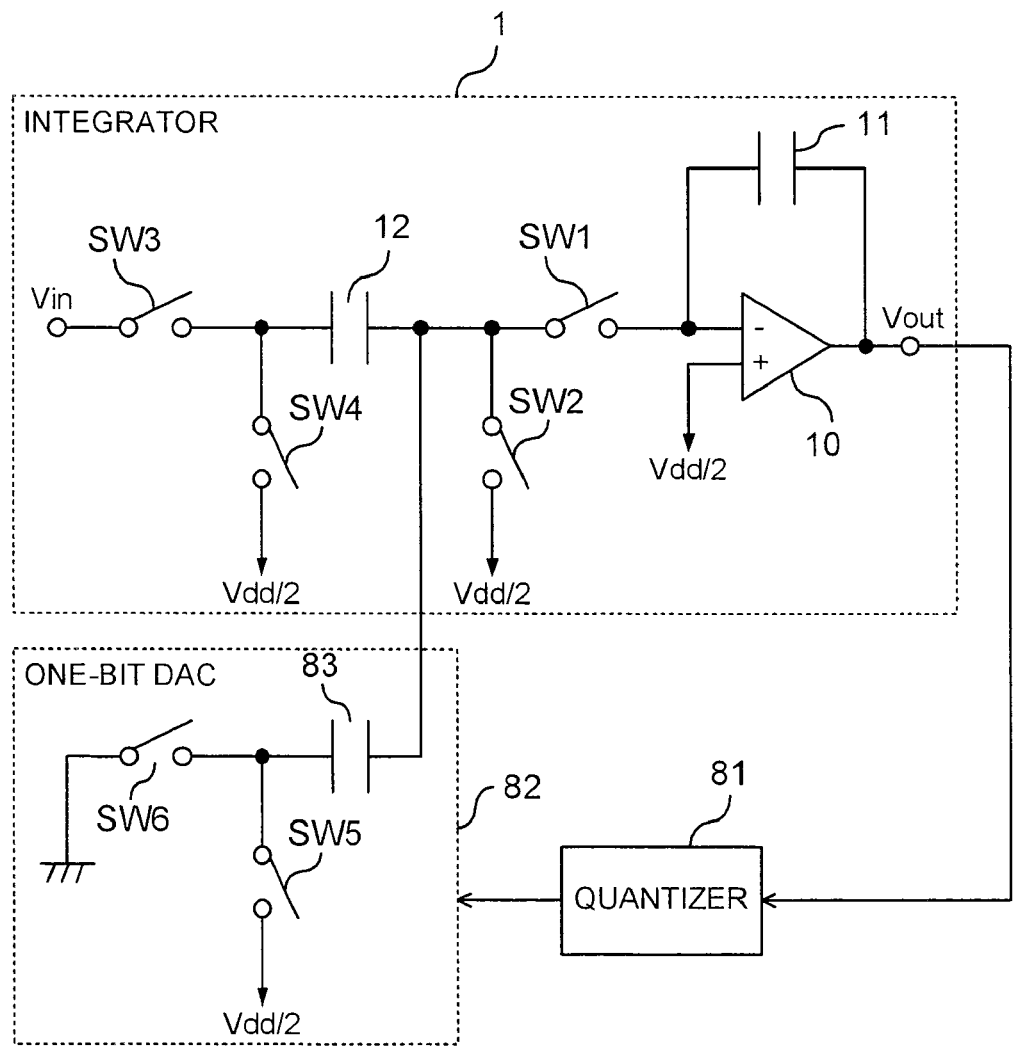
FIG. 7 shows configurations of an integrator and one-bit DAC in the $\Delta\Sigma$ modulation circuit of the embodiment.

FIG. 7 shows configurations of the integrator and the one-bit DAC in the ΔΣ modulation circuit 80 of the embodiment. The one-bit DAC 82 includes a capacitor 83 and switches SW5, SW6. One electrode of the capacitor 83 is electrically connected to the inverting input terminal of the operational amplifier 10 through the switch SW1. The switch SW5 is a switch that controls the application of the intermediate voltage Vdd/2 to the other electrode of the capacitor 83, and the switch SW6 is a switch that controls the application of the ground voltage to the other electrode to the capacitor 83.

If the output of the quantizer 81 is +1, the switch SW5 is turned on when the clock signal CK2 is H-level, and the switch SW6 is turned on when the clock signal CK1 is H-level. That is, when the switches SW2, SW3, SW5 are turned on, the capacitor accumulates the electric charge corresponding to the input voltage Vin and, since the intermediate voltage Vdd/2 is applied to the both electrodes of the capacitor 83, the capacitor 83 discharges. When the switches SW2, SW3, SW5 are turned off and the switches SW1, SW4, SW6 are turned on, a voltage difference between the both electrodes of the capacitor 83 is Vdd/2+α, which is a voltage at the inverting input terminal of the operational amplifier 10. Therefore, the electric charge accumulated in the capacitor 12 flows into the capacitor 11, and the electric charge corresponding to Vdd/2+α is taken out from the capacitor 83. That is, the one-bit DAC 82 subtracts a value corresponding to "+1" from the value integrated by the integrator 1.

When the ΔΣ modulation circuit 80 is constituted by using the integrator 1 controlled by the switch control circuit 20 in this way, since higher integration accuracy is achieved in the integrator 1, higher modulation accuracy is achieved in the ΔΣ modulation circuit 80.

Figure 8:
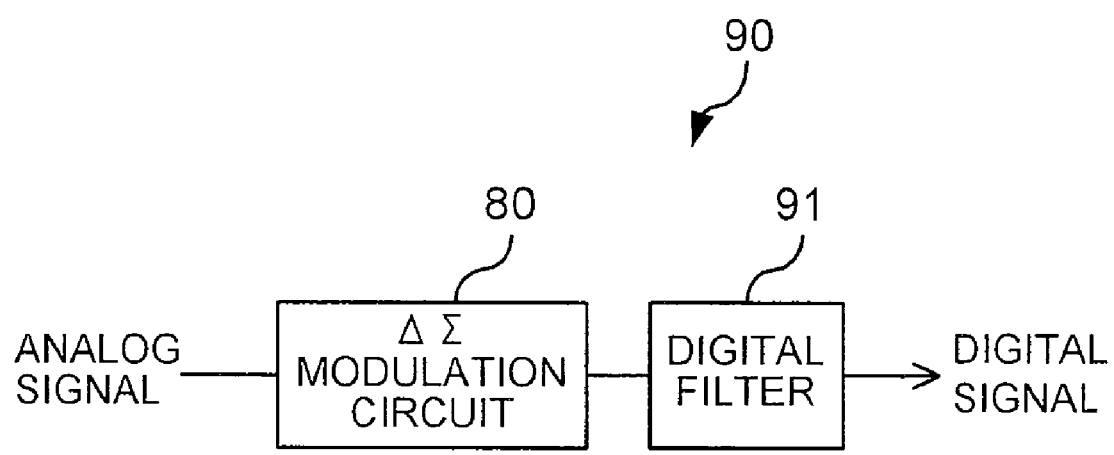
FIG. 8 shows a configuration of an AD converter using the $\Delta\Sigma$ modulation circuit of the embodiment.
Figure 9:
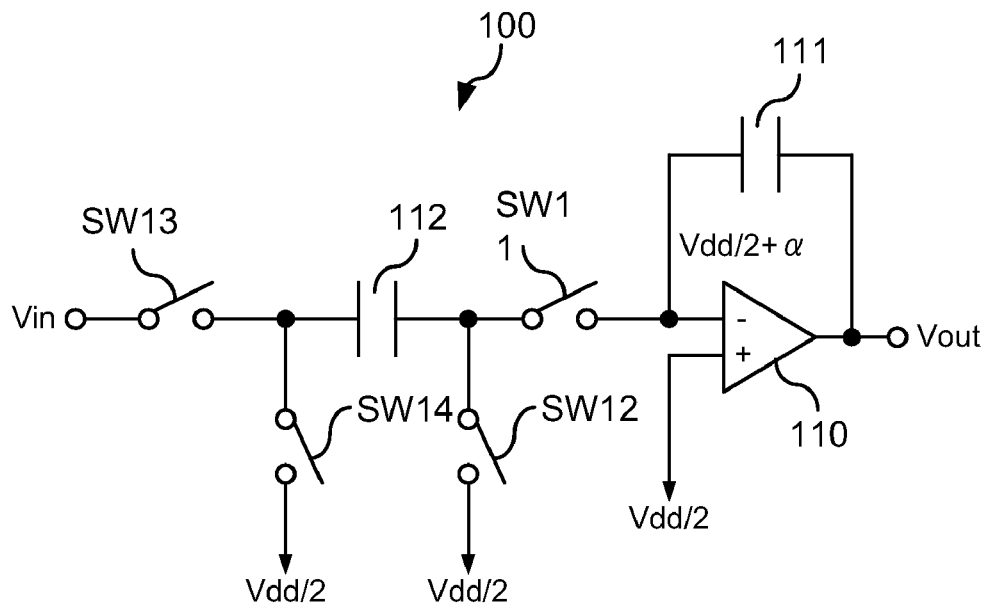
FIG. 9 shows a configuration of a typical integrator.
Figure 10:
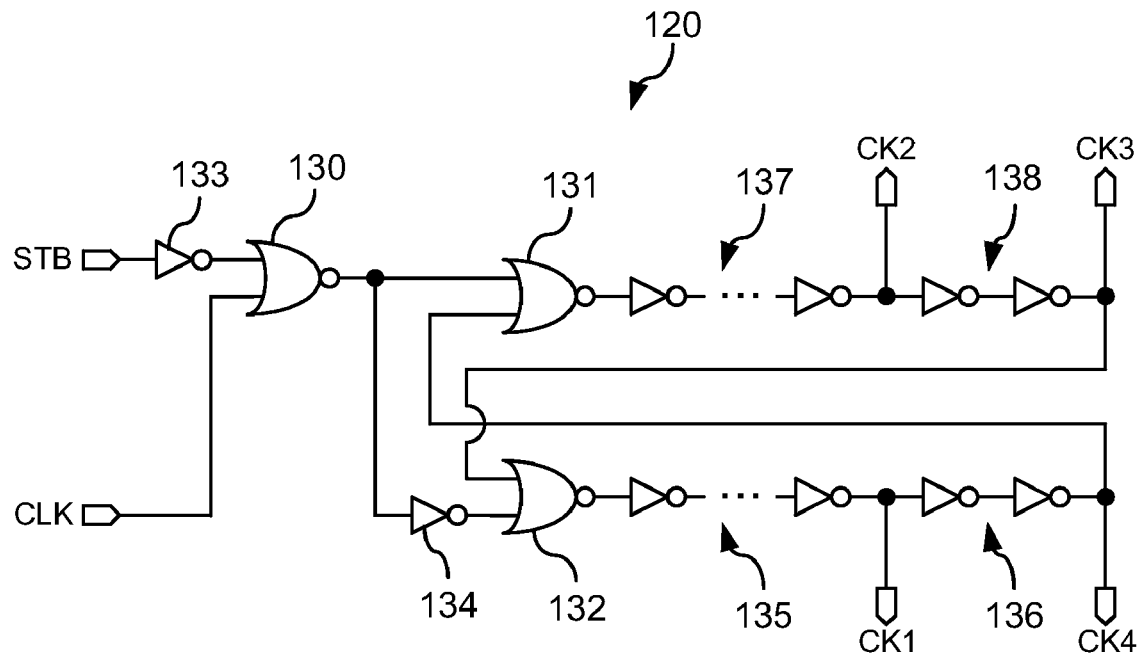
FIG. 10 shows a configuration of a typical switch control circuit that generates a four-phase clock.
Figure 11:
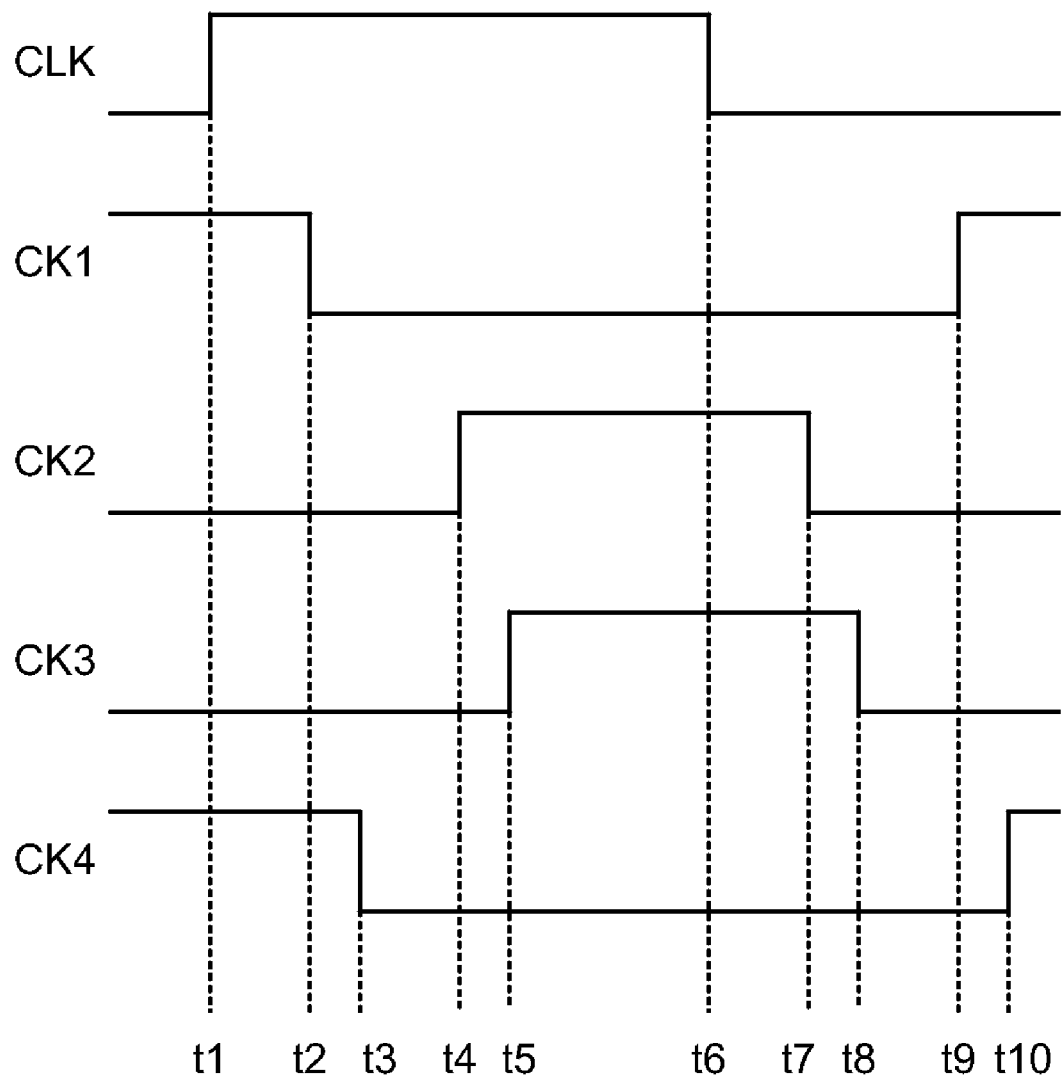
FIG. 11 is a timing chart of the operation of the typical switch control circuit.
Figure 12:
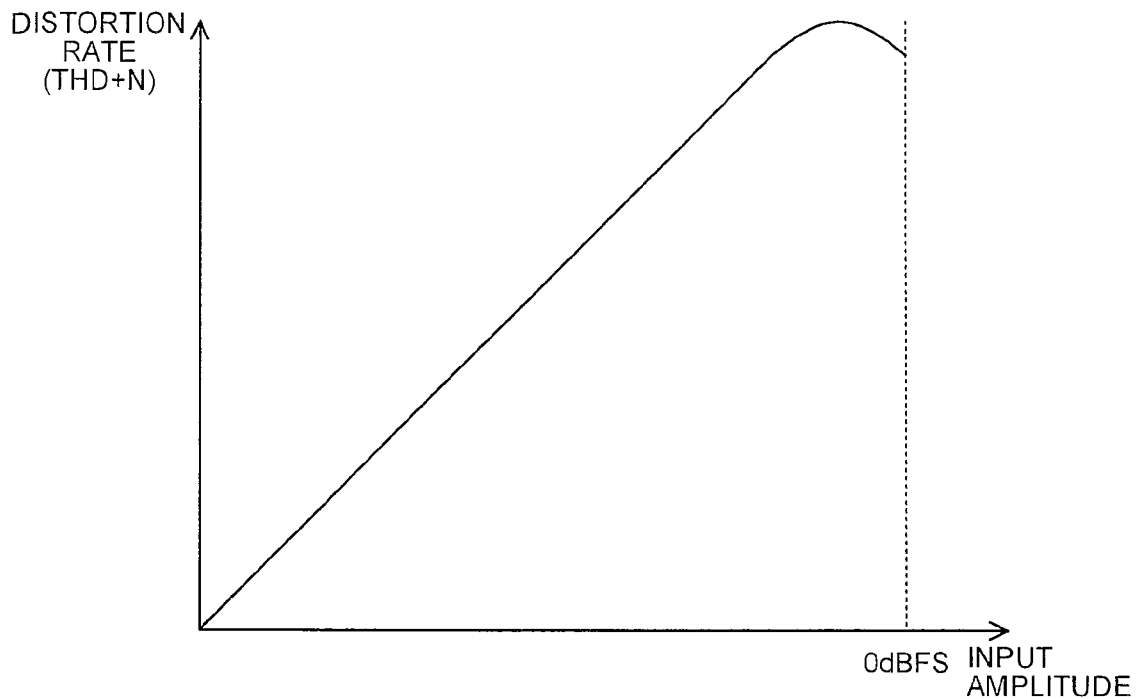
FIG. 12 shows theoretical distortion rate characteristics corresponding to amplitude of an analog signal input to a $\Delta\Sigma$ modulation AD converter.
Figure 13:
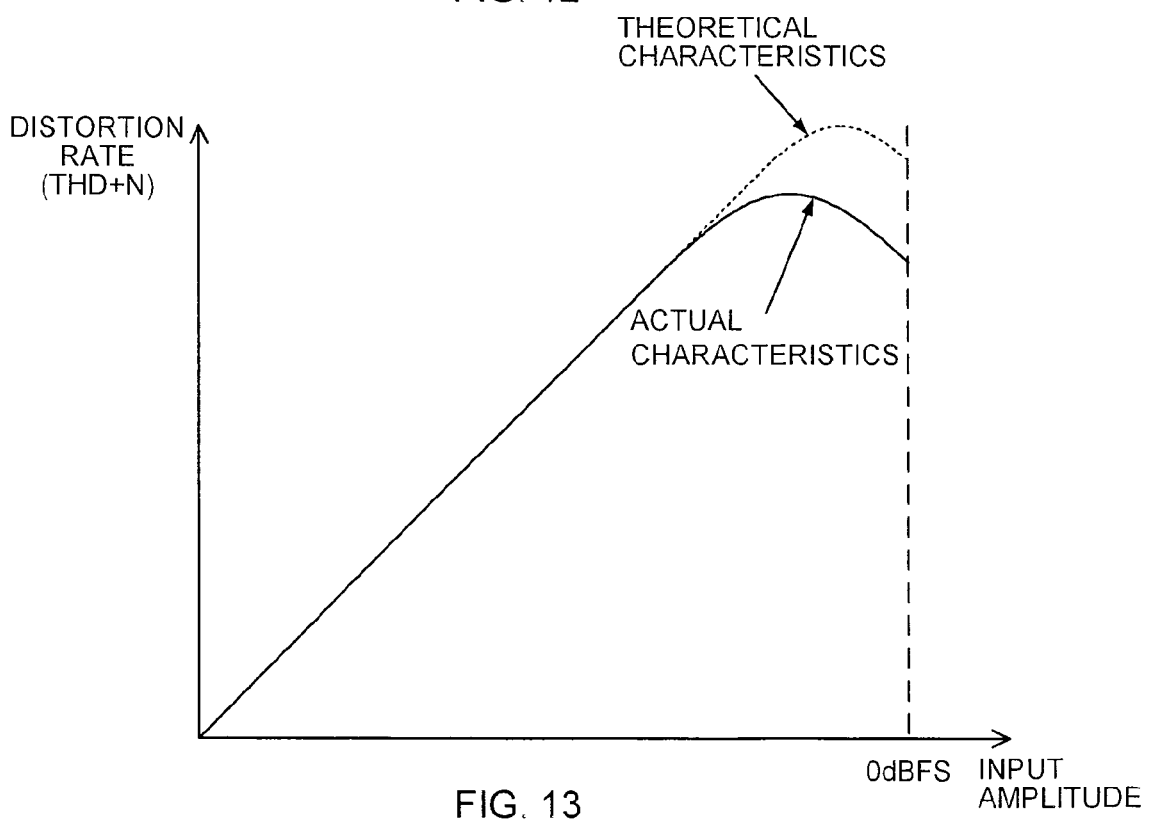
FIG. 13 shows actual distortion rate characteristics corresponding to amplitude of the analog signal input to the $\Delta\Sigma$ modulation AD converter.

FIG. 8 shows a configuration of a ΔΣ modulation AD converter using the ΔΣ modulation circuit 80 of the embodiment. An AD converter 90 includes the ΔΣ modulation circuit 80 and a digital filter 91. The A modulation circuit 80 oversamples an input analog signal at a frequency N-times (e.g., about 128 times) higher than a base band frequency and outputs the signal to reduce noise. The digital filter 91 thins the oversampled signal output from the ΔΣ modulation circuit 80 to 1/N and outputs the signal.

When the AD converter 90 is constituted by using the ΔΣ modulation circuit 80 in this way, higher modulation accuracy is achieved in the ΔΣ modulation circuit 80, deterioration of a distortion rate can be constrained in the AD converter 90.

Description has been made of the switch control circuit 20, the ΔΣ modulation circuit 80, and ΔΣ modulation AD converter 90. As described above, when the switches SW1, SW4 are on-state and the switches SW2, SW3 are off-state, the switch control circuit 20 changes the clock signals CK1, CK2 such that the switch SW1 is turned off and the switch SW2 is turned on and then changes and outputs the clock signals CK4, CK3 such that the switch SW4 is turned off and the switch SW3 is turned on. As a result, the switches SW2, SW4 are turned on simultaneously in a period before the sampling to the capacitor 12 is newly performed, and the electric charge left in the capacitor 12 due to the offset of the operational amplifier 10 is discharged. Therefore, the integration accuracy is increased in the integrator 1.

Since the clock signals CK1 to CK4 are generated based on one main clock CLK, fluctuations due to process variations are reduced in clock timing. Therefore, the on/off timing of the switches SW1 to SW4 is not shifted and the integration accuracy is increased in the integrator 1.

By using the integrator 1 controlled by the switch control circuit 20, the ΔΣ modulation circuit 80 with higher modulation accuracy can be acquired. Although the ΔΣ modulation circuit 80 is the first order one-bit ΔΣ modulation circuit in this embodiment, even when a second or more order, or multiple-bit, ΔΣ modulation circuit is configured, the modulation accuracy can be increased by using the integrator 1 controlled by the switch control circuit 20.

By using the ΔΣ modulation circuit 80 with higher modulation accuracy, the AD converter 90 capable of constraining deterioration of the distortion rate can be acquired. Especially, since a very small distortion rate is required in a higher bit, for example, 20 or more bit ΔΣ modulation AD converter, it is useful to use the integrator 1 controlled by the switch control circuit 20 of the present invention.

Although the embodiment of the present invention has been described as above, the aforementioned embodiment is for the purpose of facilitating the understanding of the present invention and not for the purpose of construing the present invention in a limited manner. The present invention may be changed/altered without departing from the spirit thereof and includes the equivalents thereof.

For example, although the ΔΣ modulation circuit 80 and the ΔΣ modulation AD converter 90 are shown as the application example of the integrator 1 controlled by the switch control circuit 20 in this embodiment, this is not a limitation to the application range and the effect due to the increase in the integration accuracy can be acquired in any circuits.

What is claimed is:

1. A switch control circuit of an integrator, the integrator including:

an operational amplifier that has an input terminal and an output terminal;

a first capacitor that has first and second electrodes, the first electrode being electrically connected to the output terminal of the operational amplifier, the second electrode being electrically connected to the input terminal of the operational amplifier;

a second capacitor that has third and fourth electrodes;

a first switch that intervenes between the third electrode of the second capacitor and the input terminal of the operational amplifier;

a second switch that causes a reference voltage to be applied to the third electrode of the second capacitor;

a third switch that causes an input voltage to be applied to the fourth electrode of the second capacitor; and a fourth switch that causes the reference voltage to be applied to the fourth electrode of the second capacitor, the switch control circuit turning on/off the second and third switches of the integrator, while turning off/on the first and fourth switches of the integrator, in a complementary manner, wherein the switch control circuit turns off the first switch after turning on the first and fourth switches, turns on the second switch after turning off the first switch, and turns the fourth and third switches off and on, respectively, after turning on the second switch.

2. The switch control circuit of claim 1, wherein when a main clock changing at predetermined time intervals is changed to one logical value, after second and third clocks for controlling the on/off of the second and third switches are changed and output so as to turn off the second and third switches, first and fourth clocks for controlling the on/off of the first and fourth switches are changed and output so as to turn on the first and fourth switches, and wherein when the main clock is changed to the other logical value, after the first and second clocks are changed and output so as to turn off the first switch and turn on the second switch, the fourth and third clocks are changed and output so as to turn off the fourth switch and turn on the third switch.

3. The switch control circuit of claim 2, comprising:

a first logical circuit to which first and second input signals are input, the first logical circuit outputting a signal corresponding to the first input signal when the first input signal is of one logical value, the first logical circuit outputting a signal corresponding to the second input signal when the first input signal is of the other logical value;

a delay circuit that delays the signal output from the first logical circuit for predetermined time to output the signal as the first clock;

a second logical circuit to which third and fourth input signals are input, the second logical circuit outputting a signal corresponding to the third input signal as the second clock when the third input signal is of one logical value, the second logical circuit outputting a signal corresponding to the fourth input signal as the second clock when the third input signal is of the other logical value;

a third logical circuit to which fifth and sixth input signals are input, the third logical circuit outputting a signal corresponding to the fifth input signal as the third clock when the fifth input signal is of one logical value, the third logical circuit outputting a signal corresponding to the sixth input signal as the third clock when the fifth input signal is of the other logical value; and a fourth logical circuit to which seventh and eighth input signals are input, the fourth logical circuit outputting a signal corresponding to the seventh input signal as the fourth clock when the seventh input signal is of one logical value, the fourth logical circuit outputting a signal corresponding to the eighth input signal as the fourth clock when the seventh input signal is of the other logical value, wherein the first input signal is a signal corresponding to the main clock, wherein the second input signal is a signal corresponding to the second clock, wherein the third input signal is a signal acquired by inverting the first input signal, wherein the fourth input signal is a signal corresponding to the signal output from the first logical circuit, wherein the fifth input signal is a signal corresponding to the signal output from the first logical circuit, wherein the sixth input signal is a signal corresponding to the fourth clock, wherein the seventh input signal is a signal corresponding to the second clock, wherein the eighth input signal is a signal corresponding to the third clock, and wherein the predetermined time in the delay circuit is longer than a time period after the fifth input signal of the one logical value is input to the third logical circuit until the third clock is output.

4. The switch control circuit of claim 3, wherein the first through fourth switches are CMOS switch circuits controlled by the first through fourth clocks and by fifth though eighth clocks acquired by inverting the first through fourth clocks, the switch control circuit comprising:

a fifth logical circuit that outputs the fifth clock acquired by inverting the first clock;

a sixth logical circuit that outputs the sixth clock acquired by inverting the second clock;

a seventh logical circuit that outputs the seventh clock acquired by inverting the third clock; and an eighth logical circuit that outputs the eighth clock acquired by inverting the fourth clock.

5. The switch control circuit of claim 1, wherein the switch control circuit keeps the second switch turned on while turning the fourth and third switches off and on, respectively.

6. The switch control circuit of claim 5, wherein the switch control circuit turns off the second and third switches before turning on the first and fourth switches.

7. A $\Delta\Sigma$ modulation circuit comprising:

an integrator that includes an operational amplifier that has an input terminal and an output terminal, a first capacitor that has first and second electrodes, the first electrode being electrically connected to the output terminal of the operational amplifier, the second electrode being electrically connected to the input terminal of the operational amplifier, a second capacitor that has third and fourth electrodes, a first switch that controls electric connection between the third electrode of the second capacitor and the input terminal of the operational amplifier, a second switch that controls application of a reference voltage to the third electrode of the second capacitor, a third switch that controls application of an input voltage to the fourth electrode of the second capacitor, and a fourth switch that controls application of the reference voltage to the fourth electrode of the second capacitor, the integrator integrating and outputting the input voltage;

a switch control circuit that turns on/off the second and third switches, while turning off/on the first and fourth switches, in a complementary manner;

a quantizer that quantizes and outputs the output of the integrator; and a subtraction circuit that reduces electric charge accumulated in the first capacitor depending on the output of the quantizer, wherein the switch control circuit turns off the first switch after turning on the first and fourth switches, turns on the second switch after turning off the first switch, and turns the fourth and third switches off and on, respectively, after turning on the second switch.

8. A ΔΣ modulation AD converter comprising:

a ΔΣ modulation circuit of claim 7 that oversamples the input voltage as an analog signal and converts the analog signal to a digital signal for output; and a digital filter that thins and outputs the oversampled digital signal output from the ΔΣ modulation circuit at a predetermined frequency.

9. The ΔΣ modulation circuit of claim 7, wherein the switch control circuit keeps the second switch turned on while turning the fourth and third switches off and on, respectively.

10. The ΔΣ modulation circuit of claim 9, wherein the switch control circuit turns off the second and third switches before turning on the first and fourth switches.

11. A method of integrating an input signal, comprising:

providing an integrator including:

an operational amplifier that has an input terminal and an output terminal;

a first capacitor that has first and second electrodes, the first electrode being electrically connected to the output terminal of the operational amplifier, the second electrode being electrically connected to the input terminal of the operational amplifier;

a second capacitor that has third and fourth electrodes;

a first switch that intervenes between the third electrode of the second capacitor and the input terminal of the operational amplifier;

a second switch that causes a reference voltage to be applied to the third electrode of the second capacitor;

a third switch that causes the input voltage to be applied to the fourth electrode of the second capacitor; and a fourth switch that causes the reference voltage to be applied to the fourth electrode of the second capacitor, turning on/off the second and third switches of the integrator, while turning off/on the first and fourth switches of the integrator, in a complementary manner, wherein the switch control circuit turns off the first switch after turning on the first and fourth switches, turns on the second switch after turning off the first switch, and turns the fourth and third switches off and on, respectively, after turning on the second switch.

12. The method of integrating an input signal of claim 11, further comprising providing a main clock changing value at predetermined time intervals; and providing first, second, third, and fourth clocks for controlling the on/off of the first, second, third, and fourth switches, respectively, wherein when the main clock is changed to one logical value, the first and fourth clocks are changed to turn on the first and fourth switches after the second and third clocks are changed to turn off the second and third switches; and wherein when the main clock is changed to the other logical value, the fourth and third clocks are changed to turn off the fourth switch and turn on the third switch after the first and second clocks are changed to turn off the first switch and turn on the second switch.

13. The method of integrating an input signal of claim 11, wherein the switch control circuit keeps the second switch turned on while turning the fourth and third switches off and on, respectively.

14. The method of integrating an input signal of claim 13, wherein the switch control circuit turns off the second and third switches before turning on the first and fourth switches.

* * * * *